United States Patent
Hara

(10) Patent No.: US 9,571,062 B2
(45) Date of Patent: Feb. 14, 2017

(54) MODULE

(71) Applicant: TAIYO YUDEN CO., LTD., Tokyo (JP)

(72) Inventor: Hiroshi Hara, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 485 days.

(21) Appl. No.: 14/091,826

(22) Filed: Nov. 27, 2013

(65) Prior Publication Data

US 2014/0210684 A1   Jul. 31, 2014

(30) Foreign Application Priority Data

Jan. 29, 2013   (JP) ................................ 2013-014851

(51) Int. Cl.
| | |
|---|---|
| *H03H 9/05* | (2006.01) |
| *H03H 7/46* | (2006.01) |
| *H03H 9/72* | (2006.01) |
| *H03H 9/70* | (2006.01) |

(52) U.S. Cl.
CPC ........... *H03H 9/0566* (2013.01); *H03H 7/463* (2013.01); *H03H 9/0571* (2013.01); *H03H 9/0576* (2013.01); *H03H 9/706* (2013.01); *H03H 9/725* (2013.01)

(58) Field of Classification Search
CPC ...... H03H 7/643; H03H 9/0566; H03H 9/725; H03H 9/706; H03H 9/0576; H03H 9/0571
USPC .......................... 333/129, 132, 133, 193, 187
See application file for complete search history.

(56) References Cited

U.S. PATENT DOCUMENTS

| | | | |
|---|---|---|---|
| 2004/0155730 A1 | 8/2004 | Iwamoto et al. | |
| 2004/0212451 A1 | 10/2004 | Iwamoto et al. | |
| 2005/0237130 A1 | 10/2005 | Iwamoto et al. | |
| 2007/0024392 A1* | 2/2007 | Inoue | H03H 9/0576 333/133 |
| 2007/0222540 A1* | 9/2007 | Nishigaki | H03H 9/706 333/133 |
| 2010/0066461 A1 | 3/2010 | Yonekura | |
| 2011/0109400 A1* | 5/2011 | Koga | H03H 9/0576 333/4 |
| 2011/0260806 A1 | 10/2011 | Takeuchi | |
| 2012/0313724 A1 | 12/2012 | Tsurunari et al. | |
| 2013/0147578 A1 | 6/2013 | Hara et al. | |
| 2014/0118084 A1 | 5/2014 | Takemura | |

FOREIGN PATENT DOCUMENTS

| | | |
|---|---|---|
| CN | 1513229 A | 7/2004 |
| CN | 1543065 A | 11/2004 |
| CN | 1691501 A | 11/2005 |

(Continued)

OTHER PUBLICATIONS

Chinese Office Action dated Apr. 18, 2016, in a counterpart Chinese patent application No. 201410039620.6.

(Continued)

*Primary Examiner* — Robert Pascal
*Assistant Examiner* — Jorge Salazar, Jr.
(74) *Attorney, Agent, or Firm* — Chen Yoshimura LLP

(57) ABSTRACT

A module includes: a duplexer including an antenna terminal; a first wiring connecting the antenna terminal to an antenna; a second wiring coupled to the antenna terminal without the first wiring; and an inductor coupled to the second wiring.

7 Claims, 12 Drawing Sheets

(56) References Cited

FOREIGN PATENT DOCUMENTS

| | | |
|---|---|---|
| CN | 101682313 A | 3/2010 |
| CN | 102204100 A | 9/2011 |
| CN | 102598507 A | 7/2012 |
| JP | 2007-259296 A | 10/2007 |
| JP | 2012-89996 A | 5/2012 |
| WO | 2009/028683 A1 | 3/2009 |
| WO | 2013/008435 A1 | 1/2013 |

OTHER PUBLICATIONS

Chinese Office Action dated Nov. 15, 2016, in a counterpart Chinese patent application No. 201410039620.6.
Japanese Office Action dated Nov. 22, 2016, in a counterpart Japanese patent application No. 2013-014851.

* cited by examiner

MODULE

CROSS-REFERENCE TO RELATED APPLICATION

This application is based upon and claims the benefit of priority of the prior Japanese Patent Application No. 2013-014851, filed on Jan. 29, 2013, the entire contents of which are incorporated herein by reference.

FIELD

A certain aspect of the present invention relates to a module.

BACKGROUND

Electronic components installed in communication devices such as mobile phones are required to be small in size and have good frequency characteristics. To obtain good frequency characteristics at high frequency, a duplexer is formed with an acoustic wave filter. For example, in Japanese Patent Application Publication No. 2012-89996, a ladder-type filter using a Film Bulk Acoustic Resonator (FBAR) is used for the duplexer. A Surface Acoustic Wave (SAW) filter, or a boundary acoustic wave filter may be used as the acoustic wave filter. To improve frequency characteristics, it is important to match the impedance between the duplexer and an antenna. A passive element such as an inductor is used as a matching element. To downsize the electronic component, the duplexer and the matching element may be mounted on a single substrate.

However, the impedance matching may be difficult due to a wiring in the substrate in the conventional techniques. When a large matching element is connected for impedance matching, the size reduction is difficult.

SUMMARY OF THE INVENTION

According to an aspect of the present invention, there is provided a module including: a duplexer including an antenna terminal; a first wiring connecting the antenna terminal to an antenna; a second wiring coupled to the antenna terminal without the first wiring; and an inductor coupled to the second wiring.

DETAILED DESCRIPTION

Figure 1:
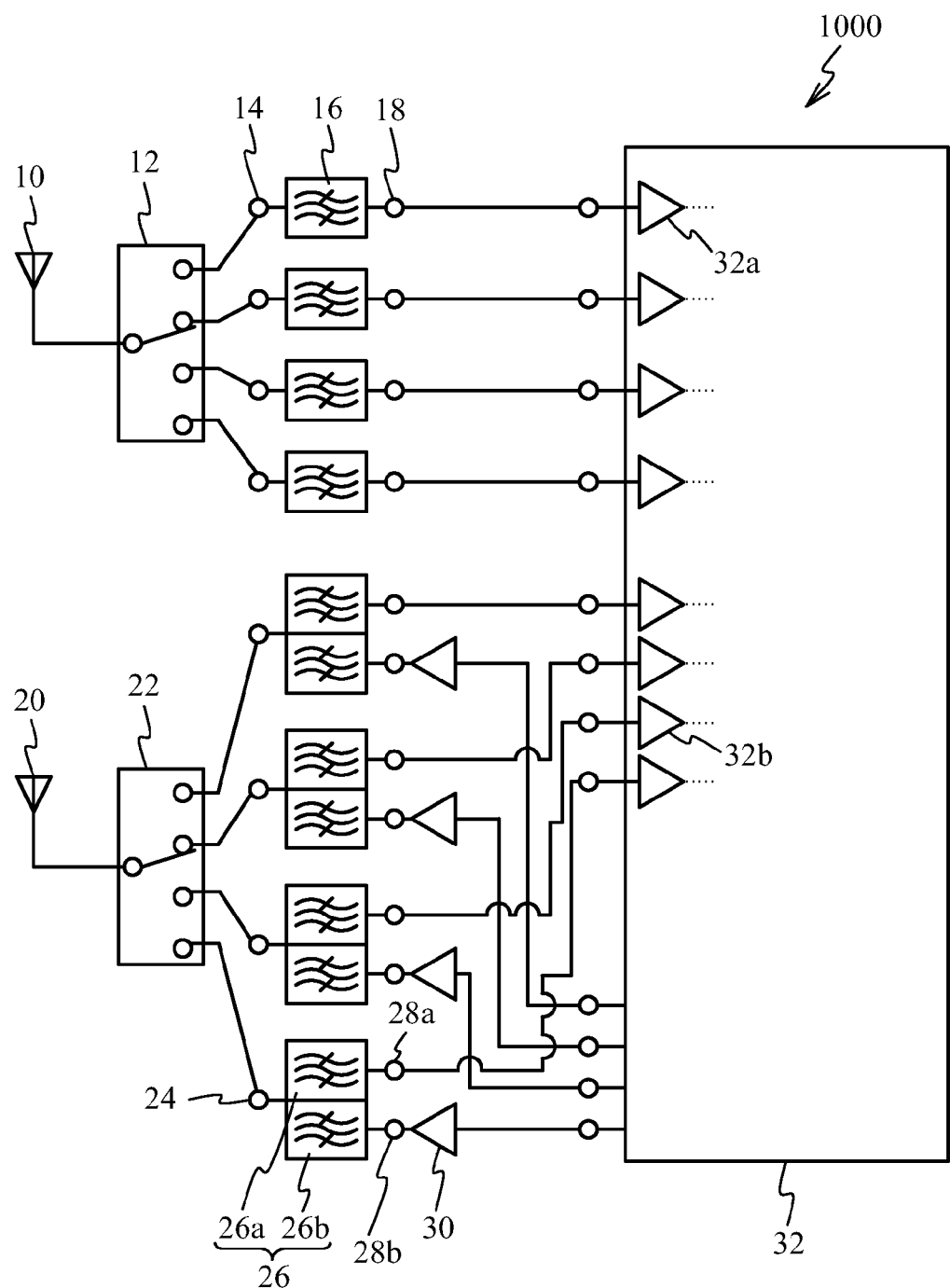
FIG. 1 is a circuit diagram illustrating a module.

A description will first be given of a module using a duplexer. FIG. 1 is a circuit diagram illustrating a module 1000. As illustrated in FIG. 1, the module 1000 includes antennas 10 and 20, switches 12 and 22, four filters 16, four duplexers 26, four power amplifiers (PA) 30, and an IC (Integrated Circuit) 32. The duplexer 26 includes a receive filter 26a and a transmit filter 26b. The IC 32 includes low noise amplifiers (LNA) 32a and 32b.

The filter 16 is a receive filter. A first end of the filter 16 is coupled to the switch 12 through an input terminal 14 while a second end thereof is coupled to the LNA 32a through an output terminal 18. First ends of the receive filter 26a and the transmit filter 26b are commonly connected to an antenna terminal 24, and coupled to the switch 22 through the antenna terminal 24. A second end of the receive filter 26a is coupled to the LNA 32b through a receive terminal 28a. A second end of the transmit filter 26b is coupled to the PA 30 through a transmit terminal 28b.

The antennas 10 and 20 receive and transmit an RF (Radio Frequency) signal. The switch 12 selects one filter from the four filters 16, and connects it to the antenna 10. The filter 16 filters a reception signal received by the antenna 10, and the LNA 32a amplifies the reception signal. The IC 32 down-converts the reception signal into a baseband signal. The switch 22 selects one duplexer from the four duplexers 26, and connects it to the antenna 20. The receive filter 26a filters a reception signal received by the antenna 20. The LNA 32b amplifies the reception signal. The IC 32 up-converts the baseband signal into a transmission signal. The PA 30 amplifies the transmission signal, and the transmit filter 26b filters the transmission signal. The antenna 20 transmits the transmission signal.

The frequency of the passband of the duplexer 26 differs from the frequency of the passband of the filter 16. The frequency of the passband of the receive filter 26a differs from the frequency of the passband of the transmit filter 26b.

Figure 2A:
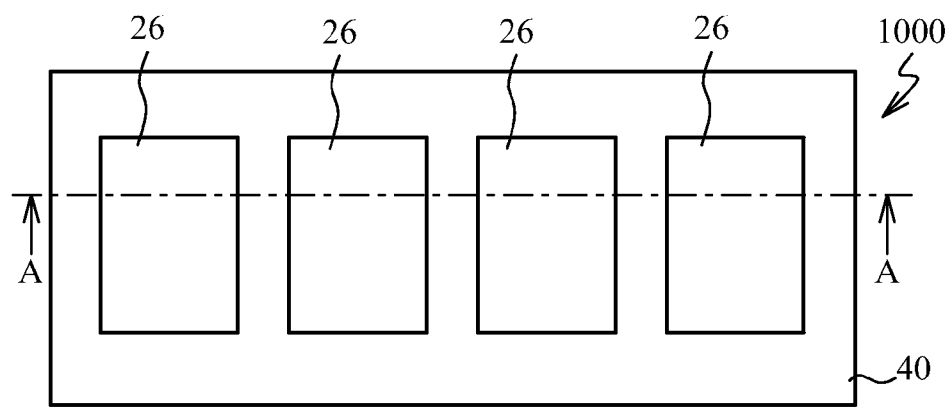
FIG. 2A is a top view illustrating the module.
Figure 2B:
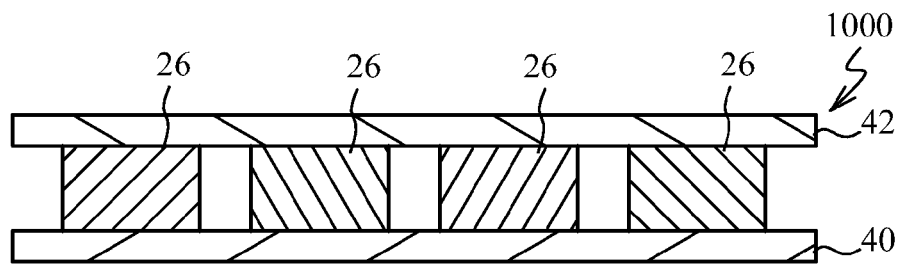
FIG. 2B is a cross-sectional view taken along line A-A in FIG. 2A.

FIG. 2A is a top view illustrating the module 1000. FIG. 2B is a cross-sectional view taken along line A-A in FIG. 2A. FIG. 2A illustrates a lid 42 transparently.

As illustrated in FIG. 2A and FIG. 2B, the duplexers 26 are formed as a package, and mounted on a single substrate 40. The lid 42 makes contact with the upper surfaces of the duplexers 26. The filter 16 may be sandwiched between the substrate 40 and the lid 42 together with the duplexer 26. The substrate 40 may be a multilayered substrate as described later. The lid 42 is formed of a metal such as kovar or an insulating material such as a resin, or a composite material of them. Hereinafter, a description will be given of a structure and frequency characteristics of one of the duplexers 26.

Figure 3A:
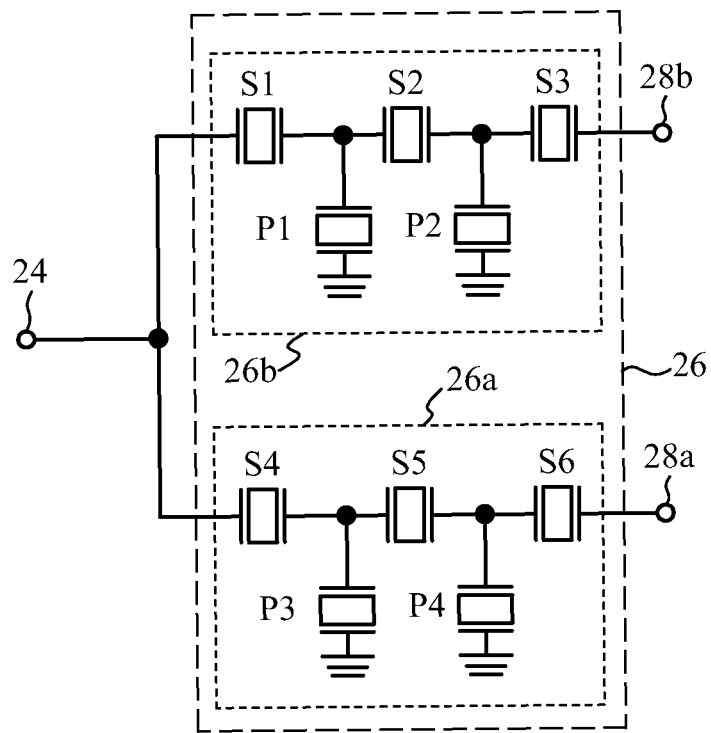
FIG. 3A is a circuit diagram illustrating a duplexer.

FIG. 3A is a circuit diagram illustrating the duplexer 26. As illustrated in FIG. 3A, the transmit filter 26b is a ladder-type filter including series resonators S1~S3 and parallel resonators P1 and P2. The series resonators S1~S3 are connected in series between the antenna terminal 24 and the transmit terminal 28b. A first end of the parallel resonator P1 is connected to a node between S1 and S2, and a second end is grounded. A first end of the parallel resonator P2 is connected to a node between S2 and S3, and a second end is grounded. The receive filter 26a is a ladder-type filter including series resonators S4~S6 and parallel resonators P3 and P4. Resonators in the receive filter 26a are arranged in the same manner as those in the transmit filter 26b.

Figure 3B:
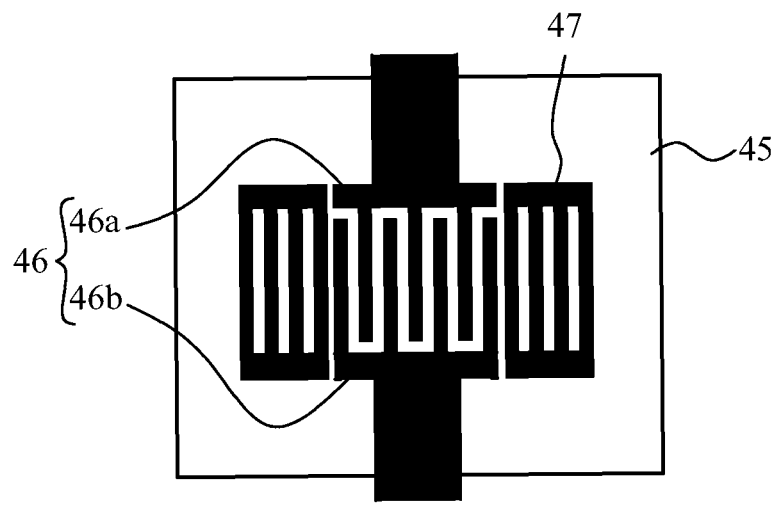
FIG. 3B is a plan view illustrating a SAW resonator.

The resonators S1~S6 and P1~P4 (hereinafter, referred to as resonators) are, for example, surface acoustic wave (SAW) resonators. FIG. 3B is a plan view illustrating a SAW resonator. As illustrated in FIG. 3B, an IDT (Interdigital Transducer) 46 and reflectors 47 are located on the upper surface of a piezoelectric substrate 45. The IDT 46 includes comb-shaped electrodes 46a and 46b facing each other, and excites a surface acoustic wave. The reflector 47 reflects the surface acoustic wave toward the IDT 46. The piezoelectric substrate 45 is made of a piezoelectric substance such as lithium tantalate ($LiTaO_3$) or lithium niobate ($LiNbO_3$). The IDT 46 and the reflectors 47 are formed of a metal such as aluminum (Al).

Figure 4A:
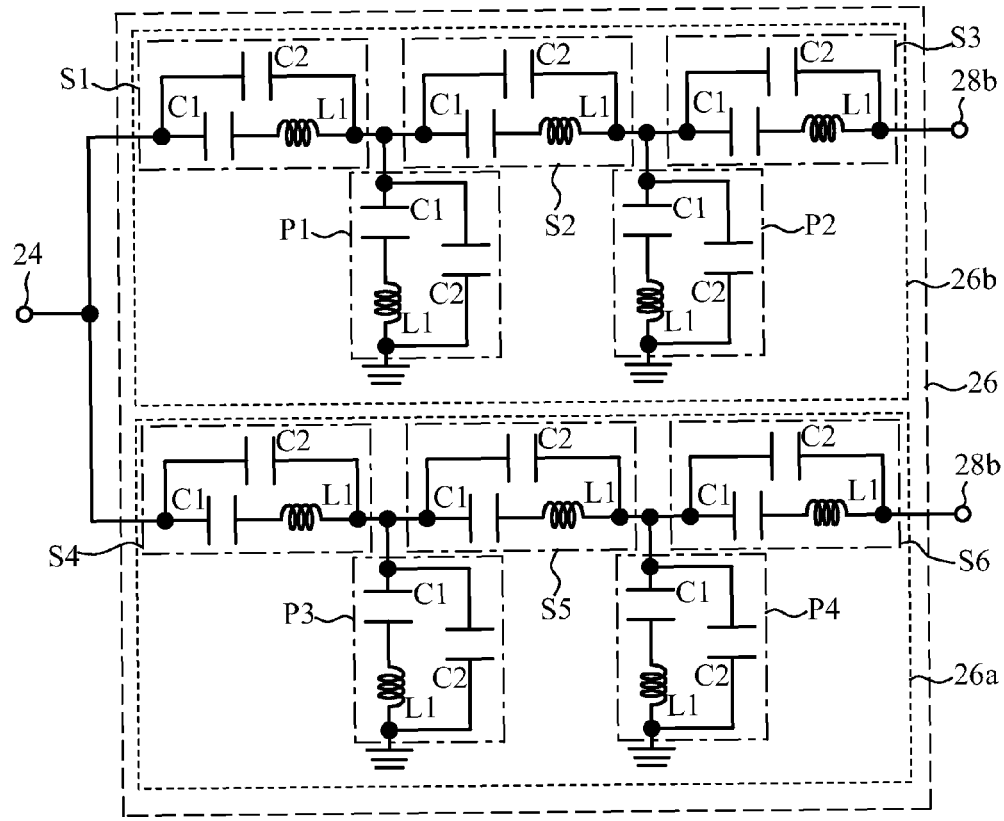
FIG. 4A is a diagram illustrating an equivalent circuit of the duplexer.

FIG. 4A is a diagram illustrating an equivalent circuit of the duplexer 26. Each resonator includes an inductor L1 and capacitors C1 and C2. The inductor L1 and the capacitor C1 are connected in series. The capacitor C2 is connected in parallel to the inductor L1 and the capacitor C1.

To obtain good frequency characteristics, the impedance is required to be matched. For example, the receive filter 26a preferably has high impedance such as infinity in the passband of the transmit filter 26b, and the transmit filter 26b preferably has high impedance in the passband of the receive filter 26a. The impedance of the duplexer 26 as viewed from the antenna 20 is preferably 50Ω, for example.

Figure 4B:
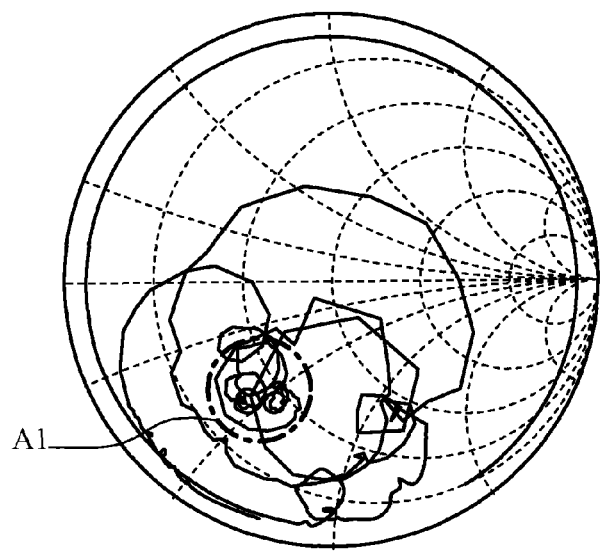
FIG. 4B is a Smith chart illustrating impedance of the duplexer as viewed from the antenna terminal.

The impedance of the duplexer 26 was simulated. The passband of the receive filter 26a includes 1960 MHz, and the passband of the transmit filter 26b includes 1880 MHz. FIG. 4B is a Smith chart illustrating the impedance of the duplexer 26 as viewed from the antenna terminal 24. The desired impedance of 50Ω is located approximately at the center of the Smith chart in FIG. 4B. A circle A1 indicated by the chain line represents the impedance in the passband. As indicated by the circle A1, the impedance of the duplexer 26 deviates from 50Ω. This is because the resonator acts as a capacitance and the impedance of the duplexer 26 as viewed from the antenna 20 becomes capacitive.

To match the impedance, a matching element such as an inductor may be connected between the antenna terminal 24 and the duplexer 26. However, there is a case in which the impedance is not appropriately matched even though the matching element is used. Hereinafter, a description will be given of the case.

Figure 5A:
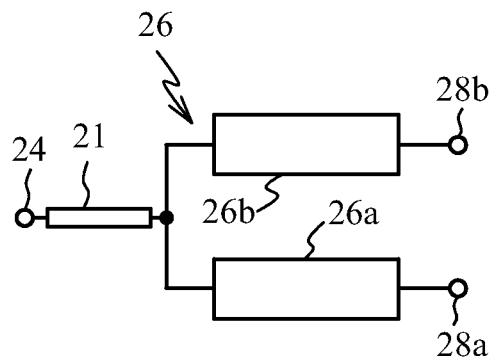
FIG. 5A is a block diagram illustrating the duplexer.
Figure 5B:
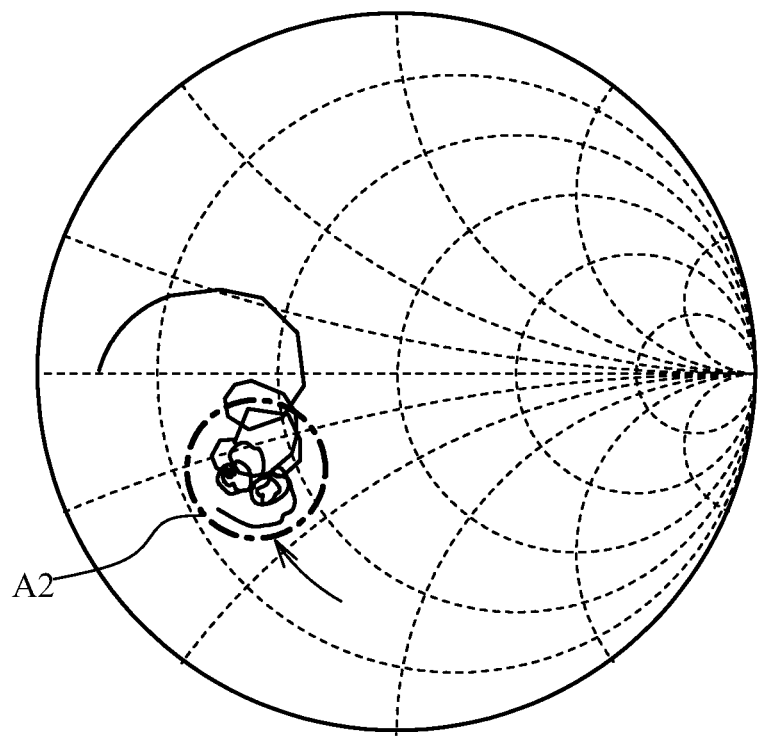
FIG. 5B is a Smith chart illustrating impedance of the duplexer as viewed from the antenna terminal.

FIG. 5A is a block diagram illustrating the duplexer 26. As illustrated in FIG. 5A, an impedance portion 21 is connected between the antenna terminal 24 and the duplexer 26. The impedance portion 21 is formed by a wiring connecting the duplexer 26 to the antenna 20. For example, a simulation was conducted under the assumption that a wiring with a length of 2 mm has an impedance of 50Ω. FIG. 5B is a Smith chart illustrating the impedance of the duplexer 26 as viewed from the antenna terminal 24. As indicated by the arrow in FIG. 5B, the impedance of the duplexer 26 rotates from the position of the circle A1 to the position of a circle A2 in FIG. 4B. This is due to the connection of the impedance portion 21.

Figure 6A:
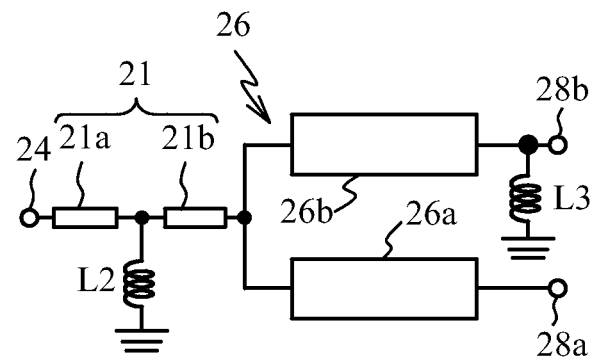
FIG. 6A is a block diagram illustrating a duplexer to which a shunt inductor is coupled.

FIG. 6A is a block diagram illustrating the duplexer 26 to which a shunt inductor is coupled. A first end of an inductor L2 is connected between an impedance portion 21a and an impedance portion 21b. This configuration corresponds to a configuration in which the inductor L2 is connected to the middle of the wiring that forms the impedance portion 21 in FIG. 5A. For example, each of the impedance portions 21a and 21b corresponds to a wiring with a length of 1 mm, and has an impedance of 50Ω. A second end of the inductor L2 is grounded. The inductor L2 acts as a shunt inductor that matches the impedance between the antenna terminal 24 and the duplexer 26. A first end of an inductor L3 is connected to a node between the transmit filter 26b and the transmit terminal 28b, and a second end of the inductor L3 is grounded. The inductor L3 matches the impedance at the transmit terminal 28b side. The impedance was simulated under the assumption that the inductance value of the inductor L2 is 3.5 nH, and the inductance value of the inductor L3 is 26 nH.

Figure 6B:
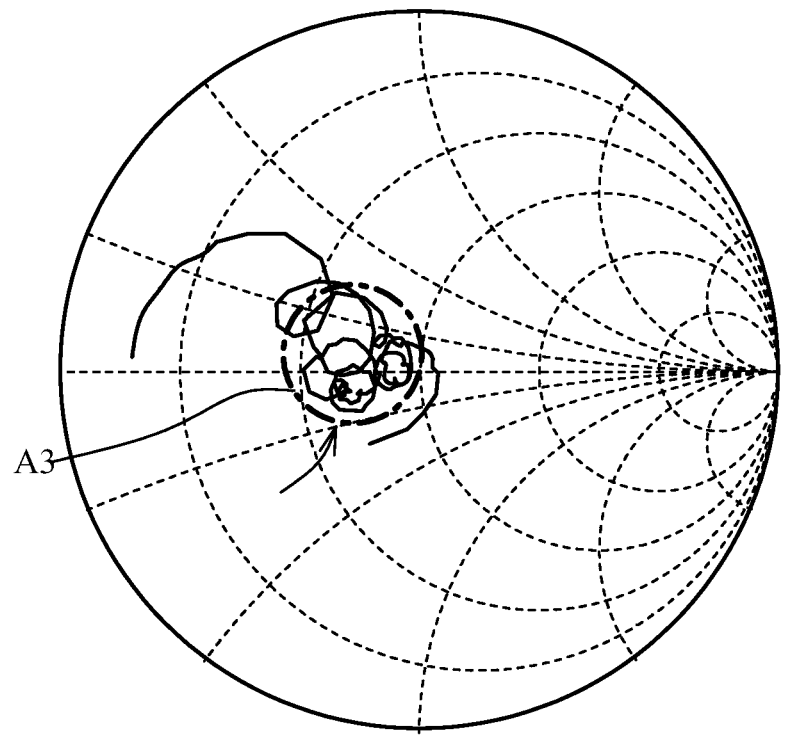
FIG. 6B is a Smith chart illustrating impedance of the duplexer as viewed from the antenna terminal.

FIG. 6B is a Smith chart illustrating the impedance of the duplexer 26 as viewed from the antenna terminal 24. As indicated by a circle A3 in FIG. 6B, the impedance is less than 50Ω. That is to say, the impedance located in the circle A2 in FIG. 5B rotates in the direction indicated by the arrow due to the inductor L2 and reaches the circle A3. As described above, it is difficult to change the impedance from the impedance located in the circle A2 to 50Ω by the inductor L2, and the impedance deviates from 50Ω as indicated by the circle A3.

Figure 7A:
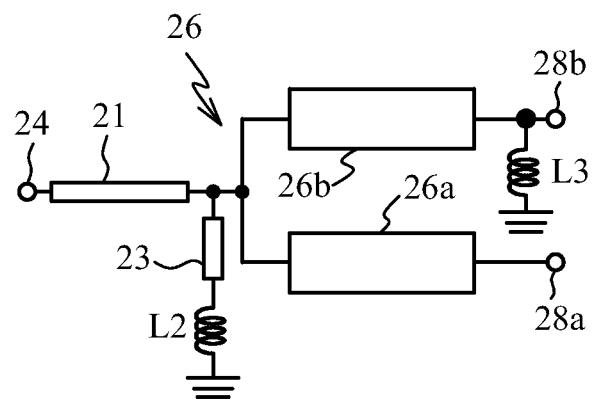
FIG. 7A is a block diagram illustrating an example that connects an inductor to the duplexer without an impedance portion.

FIG. 7A is a block diagram illustrating an example that connects the inductor L2 to the duplexer 26 without the impedance portion 21. As illustrated in FIG. 7A, a first end of an impedance portion 23 is connected to a node between the duplexer 26 and the impedance portion 21. A first end of the inductor L2 is coupled to a second end of the impedance portion 23, and a second end of the inductor L2 is grounded. The impedance portion 23 is formed by a wiring that connects the duplexer 26 to the inductor L2 and has a length of 2 mm, and has an impedance of 50Ω. A simulation was conducted under the assumption that the inductance value of the inductor L2 is 2.6 nH.

Figure 7B:
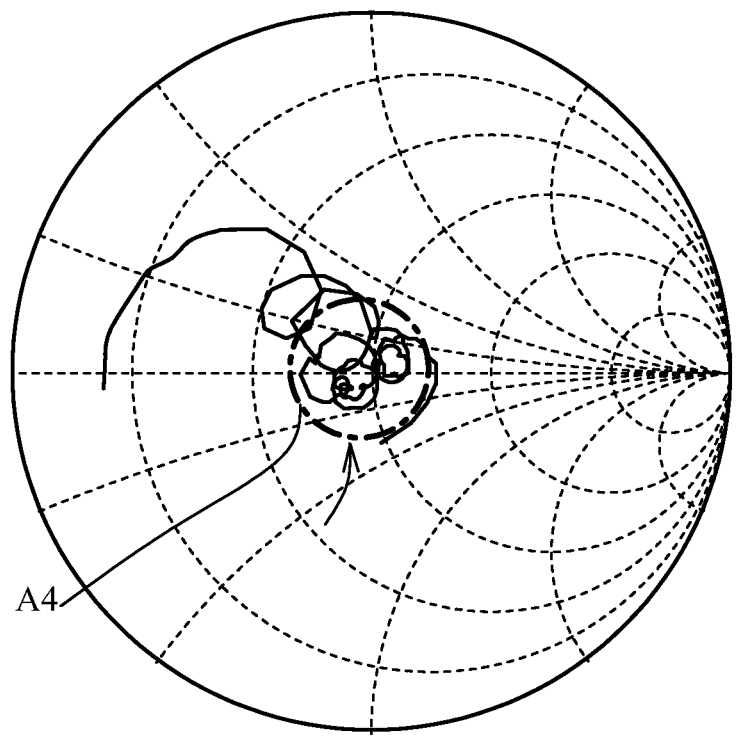
FIG. 7B is a Smith chart illustrating impedance of the duplexer as viewed from the antenna terminal.

FIG. 7B is a Smith chart illustrating the impedance of the duplexer 26 as viewed from the antenna terminal 24. As indicated by a circle A4 in FIG. 7B, the impedance is located approximately at a center of the Smith chart, i.e. is 50Ω. The duplexer 26 is connected to the inductor L2 without the impedance portion 21. Thus, the change of the impedance illustrated in FIG. 5B is suppressed. That is to say, the impedance located in the circle A1 of FIG. 4B is rotated in the direction indicated by the arrow by the inductor L2. This enables to match the impedance as illustrated in FIG. 7B. A description will be given of embodiments based on the aforementioned knowledge.

First Embodiment

Figure 8:
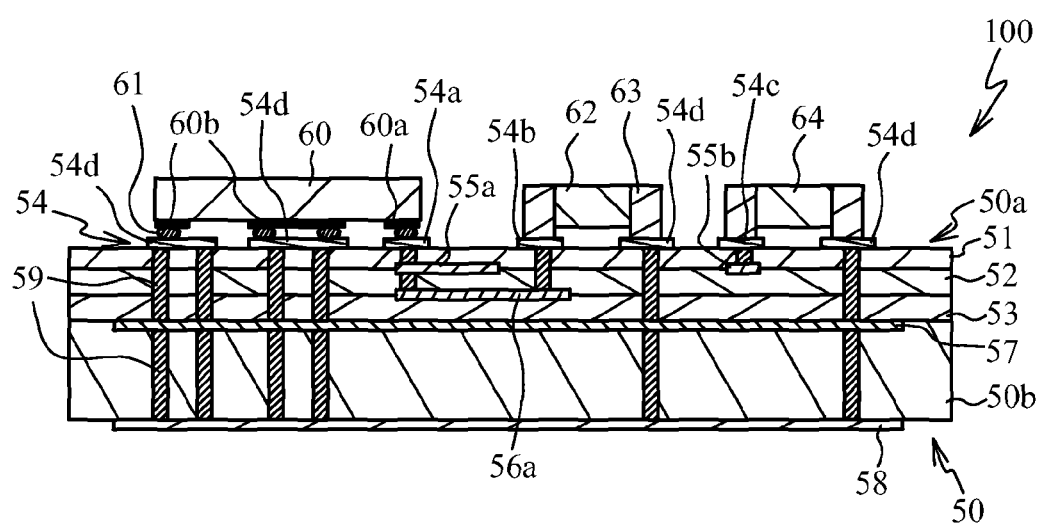
FIG. 8 is a cross-sectional view illustrating a module in accordance with a first embodiment.
Figure 9A:
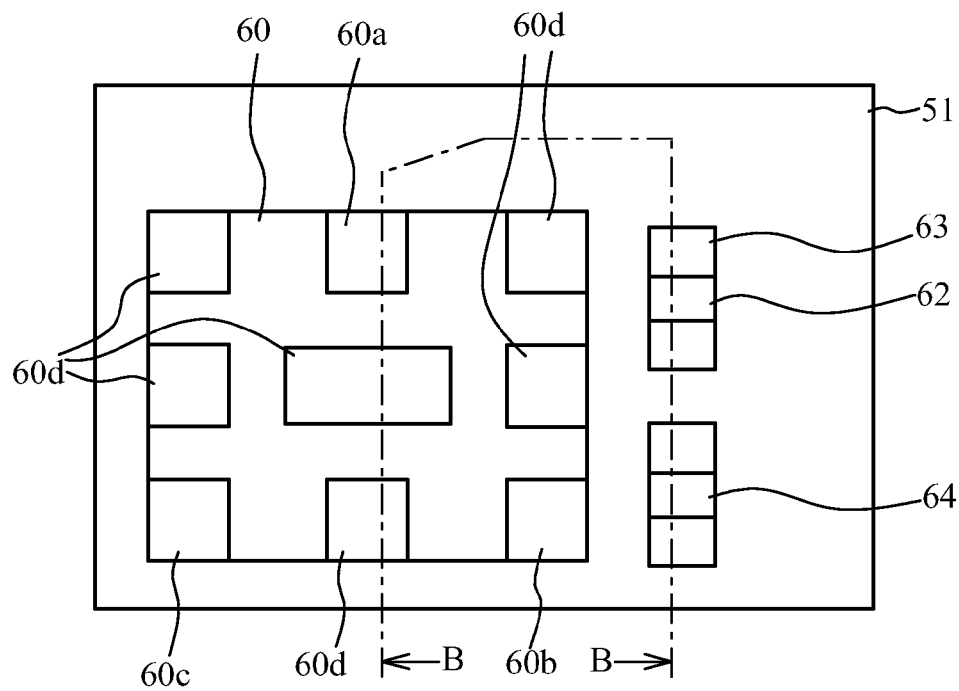
FIG. 9A and FIG. 9B are plan views illustrating insulating layers of a multilayered substrate.
Figure 9B:
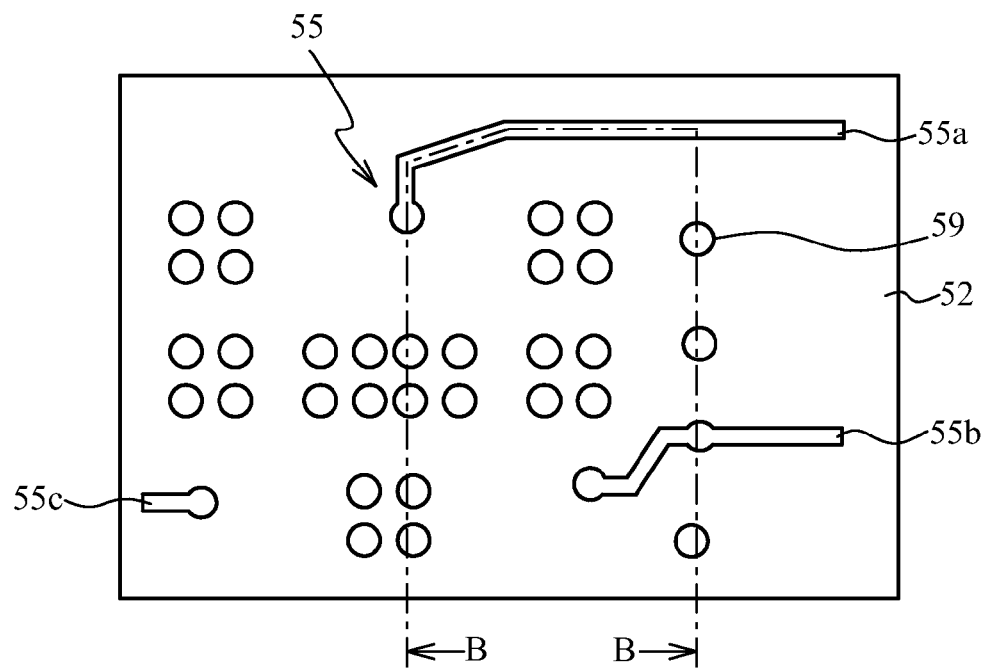
Figure 10A:
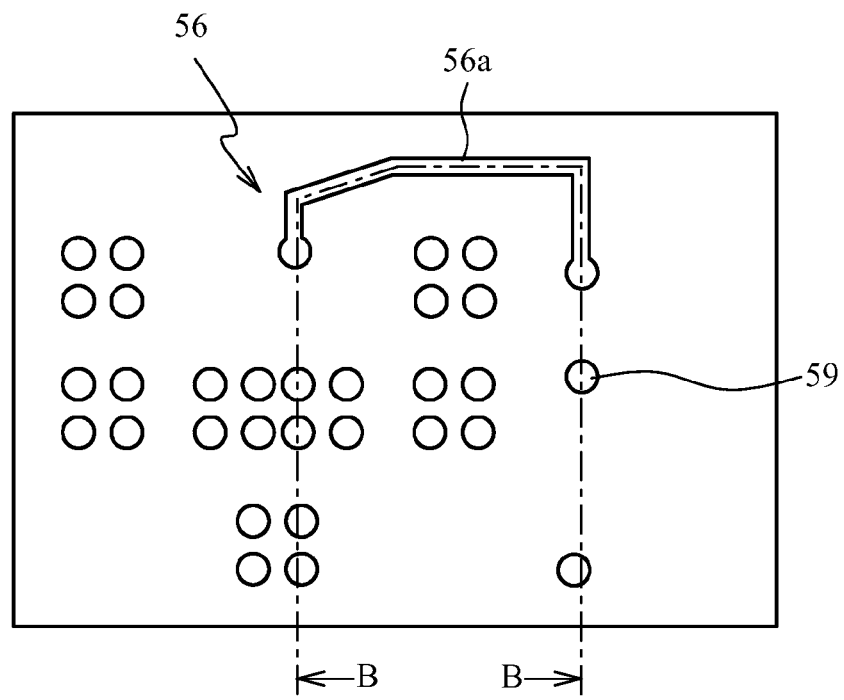
FIG. 10A is a plan view illustrating an insulating layer.
Figure 10B:
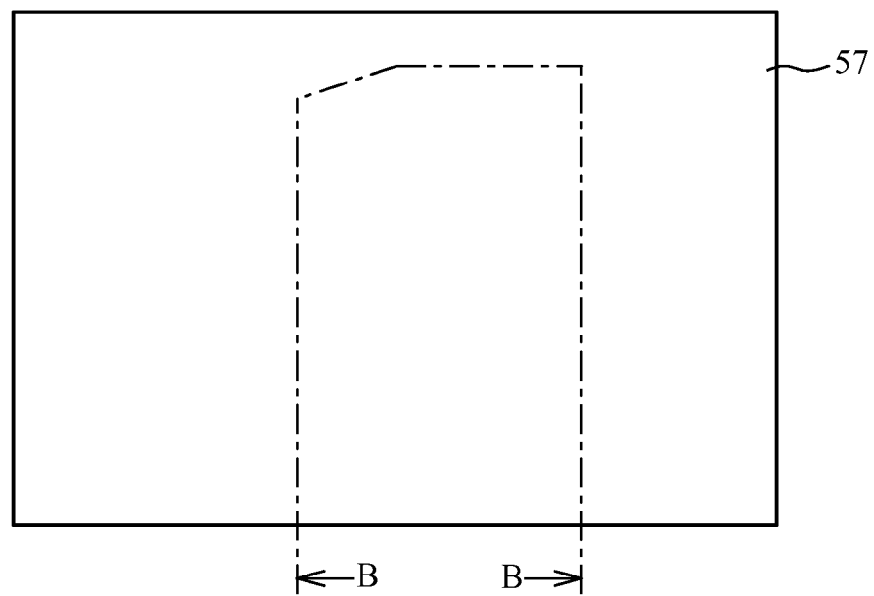
FIG. 10B is a plan view transparently illustrating the insulating layer.

A first embodiment uses a substrate 50. FIG. 8 is a cross-sectional view illustrating a module 100 in accordance with the first embodiment. FIG. 9A is a plan view illustrating an insulating layer 51 of the substrate 50. FIG. 9B is a plan view illustrating an insulating layer 52. FIG. 10A is a plan view illustrating an insulating layer 53. FIG. 10B is a plan view transparently illustrating the insulating layer 53. The duplexers and filters illustrated in FIG. 1 are mounted on the substrate 50. A description will be given of one of the duplexers.

As illustrated in FIG. 8, the module 100 includes the substrate 50, a duplexer 60, and chip components 62 and 64. The substrate 50 is formed by bonding a multilayered substrate 50a and a printed substrate 50b together. As illustrated in FIG. 8 through FIG. 10B, the multilayered substrate 50a includes the insulating layers 51, 52, and 53, and conductive layers 54, 55, 56, and 57. The insulating layers 51~53 are stacked in this order from the top. The conductive layer 54 is located on the upper surface of the insulating layer 51, and the conductive layer 55 is located between the insulating layers 51 and 52. The conductive layer 56 is located between the insulating layers 52 and 53, and the conductive layer 57 is located on the lower surface of the insulating layer 53. The printed substrate 50b is bonded to the lower surface of the insulating layer 53. As illustrated in FIG. 8, a conductive layer 58 is located on the lower surface of the printed substrate 50b.

As illustrated in FIG. 8, the conductive layer 54 includes an antenna pad 54a, pads 54b and 54c, and grounding pads 54d, and further includes a receive pad and a transmit pad not illustrated. As illustrated in FIG. 8 and FIG. 9B, the conductive layer 55 includes an antenna wiring 55a (first wiring), a transmit wiring 55b, and a receive wiring 55c. As illustrated in FIG. 8 and FIG. 10A, the conductive layer 56 includes a wiring 56a (second wiring). As illustrated in FIG. 10B, the conductive layer 57 is a solid pattern, and acts as a grounding terminal.

The conductive layers are electrically interconnected by via wirings 59 that penetrate through the insulating layers in the thickness direction. The antenna pad 54a of the conductive layer 54 is coupled to the antenna wiring 55a of the conductive layer 55 and the wiring 56a of the conductive layer 56 through the via wiring 59. The antenna wiring 55a is coupled to the antenna through the switch. Illustration of the switch and the antenna is omitted in FIG. 8 through FIG. 10B. The wiring 56a is coupled to the pad 54b of the conductive layer 54 through the via wiring 59. The pad 54c is coupled to an unillustrated IC through the transmit wiring 55b. The receive wiring 55c is coupled to the IC. The grounding pad 54d is coupled to the conductive layer 57.

As illustrated in FIG. 8 and FIG. 9A, the duplexer 60 is formed as a package, and flip-chip mounted on the substrate 50. The receive filter and the transmit filter of the duplexer 60 are, for example, SAW filters. On the lower surface of the duplexer 60, located are an antenna pad 60a, a transmit pad 60b, a receive pad 60c, and six grounding pads 60d. These terminals are electrically connected to the conductive layer 54 through solder bumps 61. The antenna pad 60a is coupled to the antenna pad 54a of the conductive layer 54, and the transmit pad 60b is coupled to the transmit pad of the conductive layer 54. The receive pad 60c is coupled to the receive pad of the conductive layer 54. The grounding pad 60d is coupled to the grounding pad 54d of the conductive layer 54. The antenna pad 60a corresponds to the antenna terminal 24 in FIG. 1, the transmit pad 60b corresponds to the transmit terminal 28b, and the receive pad 60c corresponds to the receive terminal 28a.

The chip component 62 includes the inductor L2 illustrated in FIG. 7A, and the chip component 64 includes the inductor L3. The chip components 62 and 64 are electrically connected to the conductive layer 54 through solder 63. A first end of the chip component 62 is coupled to the pad 54b, and a second end is coupled to the grounding pad 54d. A first end of the chip component 64 is coupled to the pad 54c, and a second end is coupled to the grounding pad 54d.

Two wirings (the antenna wiring 55a and the wiring 56a) are coupled to the antenna pad 54a. The wiring 56a is coupled to the antenna wiring 55a through the via wiring 59, and is not a wiring that diverges from the middle of the antenna wiring 55a. Thus, the duplexer 60 is coupled to the chip component 62 without the antenna wiring 55a. The antenna wiring 55a corresponds to the impedance portion 21 in FIG. 7A, and the wiring 56a corresponds to the impedance portion 23. That is to say, the module 100 has the same structure as the structure illustrated in FIG. 7A. Therefore, the impedance matching illustrated in FIG. 7B is possible in the first embodiment.

Figure 11A:
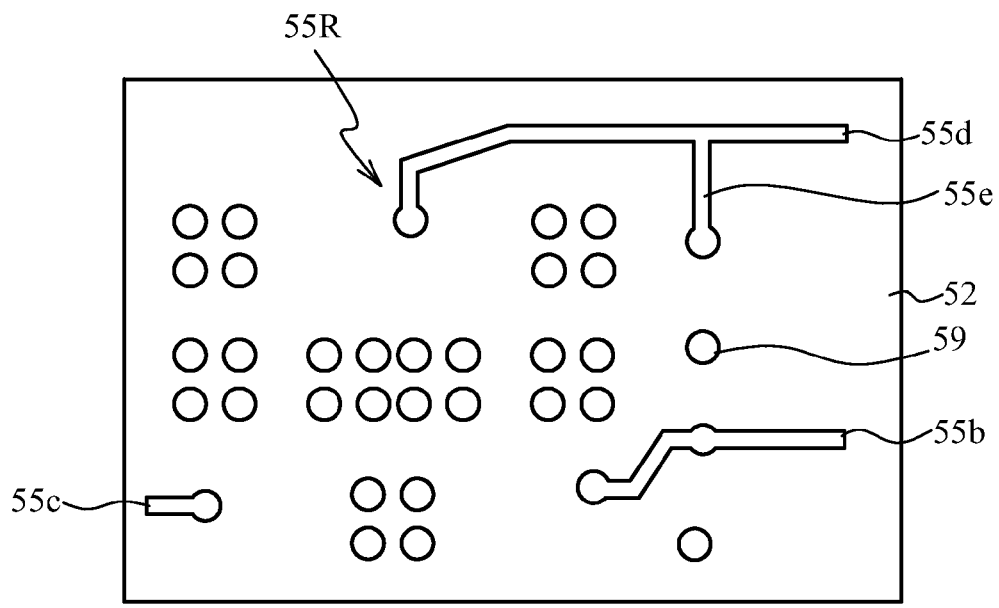
FIG. 11A and FIG. 11B are plan views illustrating insulating layers in a comparative example.
Figure 11B:
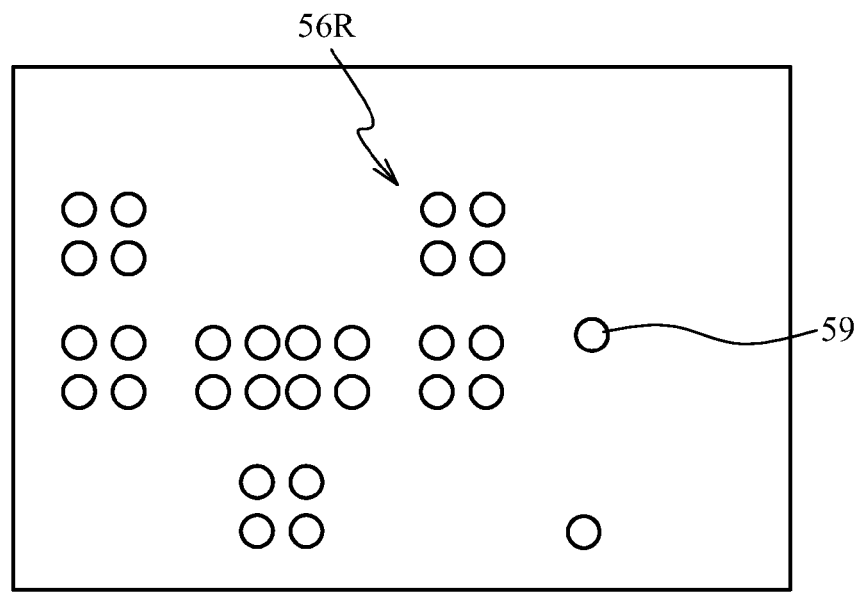

A description will next be given of a comparative example. A module corresponding to the module illustrated in FIG. 6A is formed with a multilayered substrate. FIG. 11A is a plan view illustrating an insulating layer 52R in the comparative example. FIG. 11B is a plan view illustrating an insulating layer 53R.

As illustrated in FIG. 11A, a conductive layer 55R includes an antenna wiring 55d and a wiring 55e. The wiring 55e is coupled to the antenna wiring 55d, and diverges from the antenna wiring 55d. As illustrated in FIG. 11B, a conductive layer 56R does not include the wiring 56a. The antenna pad 60a of the duplexer 60 is coupled to the antenna wiring 55d through the antenna pad 54a and the via wiring 59. A first end of the chip component 62 is coupled to the wiring 55e through the pad 54b and the via wiring 59.

The antenna wiring 55d corresponds to the impedance portion 21 in FIG. 6A. The wiring 55e diverging from the antenna wiring 55d is coupled to the chip component 62. That is to say, the duplexer 60 is coupled to the chip component 62 through a part of the antenna wiring 55d. This configuration corresponds to a configuration in which the inductor L2 is connected through the impedance portion 21b as illustrated in FIG. 6A. Thus, in a module 100R, the impedance matching is difficult as described in FIG. 6B.

The antenna wiring 55a and the wiring 56a of the module 100 are located in the different conductive layers in the substrate 50. The antenna wiring 55a and the wiring 56a overlap with each other in the thickness direction of the substrate 50. Thus, the area in which the wiring is placed can be reduced, and the size of the module 100 can be therefore reduced. The duplexer 60 is flip-chip mounted, and the inductors L2 and L3 are chip components. Therefore, the size of the module 100 can be effectively reduced.

The insulating layers 51~53 are formed of an insulating material such as Low Temperature Co-fired Ceramics (LTCC). The conductive layers 54~57 and the via wiring 59 are formed of a metal such as copper (Cu). For example, the insulating layers 51~53 may be formed of a resin such as a glass epoxy. The lid may be located as illustrated in FIG. 2B.

Second Embodiment

Figure 12A:
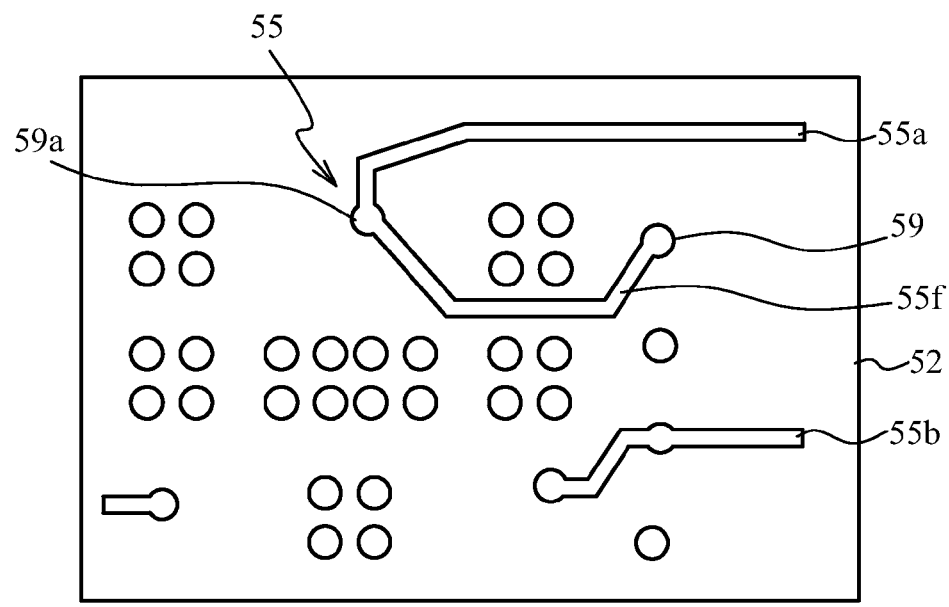
FIG. 12A and FIG. 12B are plan views illustrating insulating layers.
Figure 12B:
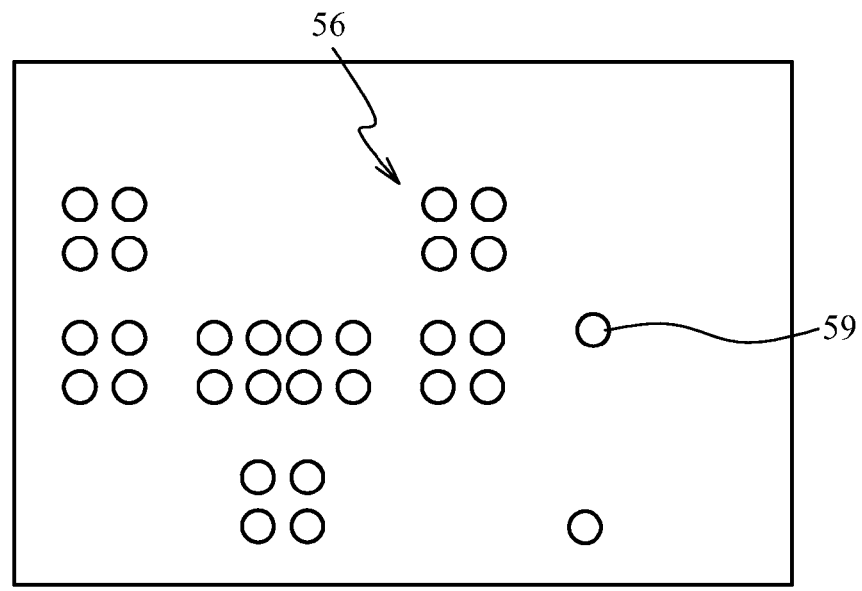

A second embodiment locates the wirings in the same conductive layer. FIG. 12A is a plan view illustrating the insulating layer 52. FIG. 12B is a plan view illustrating the insulating layer 53.

As illustrated in FIG. 12A, the conductive layer 55 includes the antenna wiring 55a and a wiring 55f. The antenna wiring 55a and the wiring 55f are coupled to the antenna pad 54a of the conductive layer 54 through a via wiring 59a of the via wirings 59. That is to say, the antenna wiring 55a and the wiring 55f extend from the via wiring 59a. However, the wiring 55f does not intersect with the antenna wiring 55a. The wiring 55f is coupled to a first end of the chip component 62 through the via wiring 59 and the pad 54b. Thus, the duplexer 60 is coupled to the chip component 62 without the antenna wiring 55a. The wiring 55f corresponds to the impedance portion 23 in FIG. 7A. That is to say, the second embodiment enables to match the impedance. As illustrated in FIG. 12B, the conductive layer 56 does not include the wiring 56a.

The duplexer 60 may include an acoustic wave filter such as a boundary acoustic wave filter, a Love wave filter, or a Film Bulk Acoustic Wave (FBAR) filter instead of the SAW filter. As illustrated in FIG. 4A, acoustic wave filters including an IDT act as a capacitance. Therefore, it is important to match the impedance by connecting the inductor L2.

The chip components 62 and 64 may include other passive elements such as a capacitor or a resistor in addition to the inductor. Chip components that enable to obtain desired impedance are used. The number of the insulating layers and the conductive layers included in the substrate 50 may be changed. Or, a single-layer substrate may be used. For example, the antenna wiring 55a and the wiring 55f may be formed on the upper surface of a single-layer substrate as described in the second embodiment. This simplifies the structure of the module, and thus the cost can be reduced. The duplexer 60 may be embedded inside the substrate 50.

Although the embodiments of the present invention have been described in detail, it is to be understood that the various change, substitutions, and alterations could be made hereto without departing from the spirit and scope of the invention.

What is claimed is:

1. A module comprising:
a duplexer including an antenna terminal;
a first wiring connecting the antenna terminal to an antenna;
a second wiring coupled to the antenna terminal without the first wiring; and
an inductor coupled to the second wiring,
wherein
the duplexer is mounted on a substrate,
the first wiring and the second wiring are located in the substrate, and
the inductor is included in a chip component mounted on the substrate.

2. The module according to claim 1, wherein
a first end of the inductor is coupled to the second wiring, and a second end of the inductor is grounded.

3. The module according to claim 1, wherein
the substrate is a multilayered substrate including conductive layers that are stacked, and
the first wiring and the second wiring are located in different conductive layers of the conductive layers.

4. The module according to claim 1, wherein
the duplexer includes an acoustic wave filter, and
the acoustic wave filter includes an IDT.

5. The module according to claim 1, wherein
the duplexer is flip-chip mounted on an upper surface of the substrate,
the antenna terminal is coupled to an antenna pad located on the upper surface of the substrate,
the first wiring is coupled to the antenna pad, and
the second wiring is coupled to the antenna pad without the first wiring.

6. A module comprising:
a duplexer including an antenna terminal;
a first wiring connecting the antenna terminal to an antenna;
a second wiring coupled to the antenna terminal without the first wiring; and
an inductor coupled to the second wiring,
wherein
the substrate is a multilayered substrate including insulating layers and conductive layers respectively located on surfaces of the insulating layers,
the first wiring and the second wiring are located in different conductive layers of the conductive layers and extend at a surface direction of the insulating layers, and
a via wiring that penetrates through an insulating layer located between the different conductive layers connects the first wiring and the second wiring.

7. A module comprising:
a duplexer including an antenna terminal;
a first wiring connecting the antenna terminal to an antenna;
a second wiring coupled to the antenna terminal without the first wiring; and
an inductor coupled to the second wiring,
wherein
the duplexer is flip-chip mounted on an upper surface of the substrate,
the antenna terminal is coupled to an antenna pad located on the upper surface of the substrate,
the first wiring is coupled to the antenna pad,
the second wiring is coupled to the antenna pad without the first wiring, and
the first wiring and the second wiring are located on the same surface of an insulating layer included in the substrate.

* * * * *